United States Patent [19]

Chapin et al.

[11] Patent Number: 4,504,697

[45] Date of Patent: Mar. 12, 1985

[54] SEALED ELECTRICAL DEVICES

[75] Inventors: Howard R. Chapin, Park Ridge; Arnold E. Gurley, Evanston, both of Ill.

[73] Assignee: Littelfuse, Inc., Des Plaines, Ill.

[21] Appl. No.: 372,615

[22] Filed: Apr. 28, 1982

[51] Int. Cl.³ .............................................. H05K 5/00
[52] U.S. Cl. .................................. 174/52 R; 335/202; 339/91 R
[58] Field of Search ...................... 174/52 R, 52 S, 50, 174/44; 335/202; 339/91 R

[56] References Cited

U.S. PATENT DOCUMENTS

| | | | |
|---|---|---|---|
| 3,304,361 | 2/1967 | Sharp | 174/44 |
| 4,149,131 | 4/1979 | Kawamura et al. | 335/202 |
| 4,320,369 | 3/1982 | Bukala | 335/202 |

FOREIGN PATENT DOCUMENTS 2061621  5/1981  United Kingdom ............... 335/202

*Primary Examiner*—John Gonzales
*Assistant Examiner*—D. A. Tone
*Attorney, Agent, or Firm*—Russell E. Hattis

[57] ABSTRACT

A sealed electrical device like a relay includes a support base, a relay device on the inner side of the support base through which extends longitudinally-exposed terminals for feeding current to the relay device, and a housing having a relay-enclosing portion, and a stepped intermediate portion forming a continuation of the device-enclosing portion and making a face-to-face sealing engagement with longitudinally and laterally outwardly facing surfaces on the support base so that there is no straight-on access of a water stream external to said housing into the interior thereof on the inner side of the support base from either a lateral or longitudinal direction. The intermediate housing portion terminates in a sealing skirt-forming end portion extending a substantial distance longitudinally beyond the sealed portion of the support base to act as a further barrier against the ingress of an external water stream into the interior of said housing on the inner side of said support base. The support base has longitudinally extending connector guide walls on the outer side thereof enclosed by the housing skirt portion. The housing is secured to the support base by interlocking means on the inside of the skirt portion and the outside of said longitudinally extending walls. Means are provided for interlocking the housing skirt portion with a releasable locking means on the connector unit.

7 Claims, 12 Drawing Figures

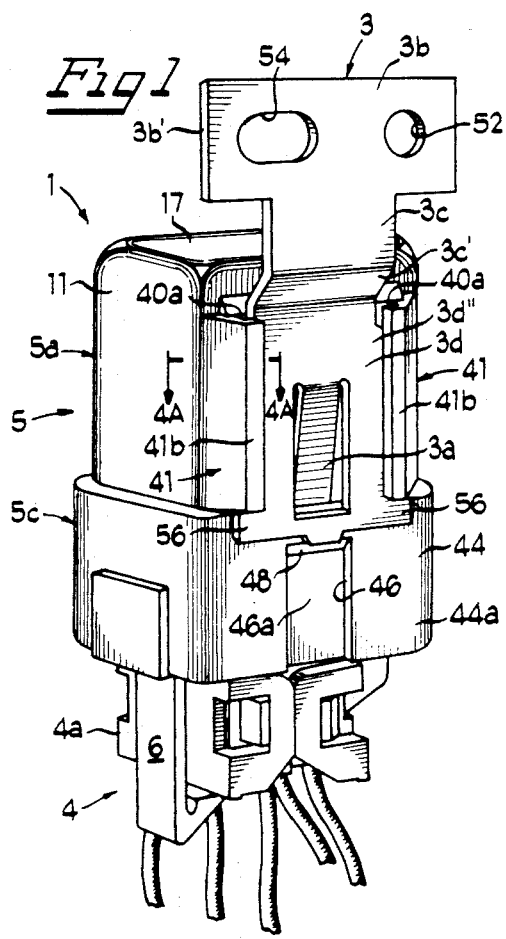
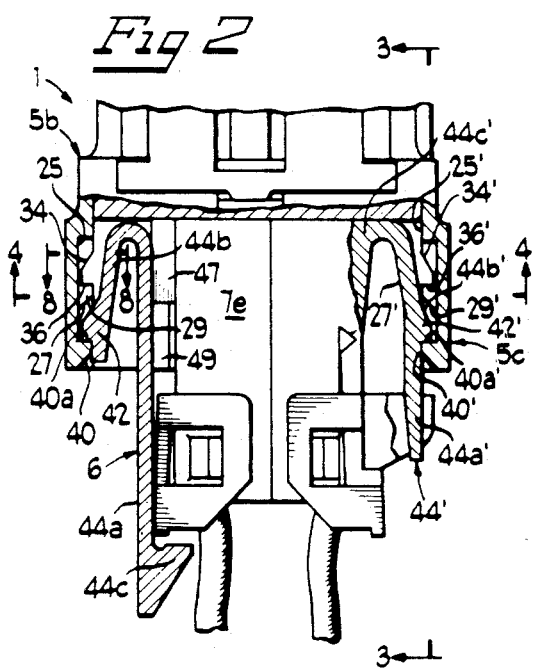
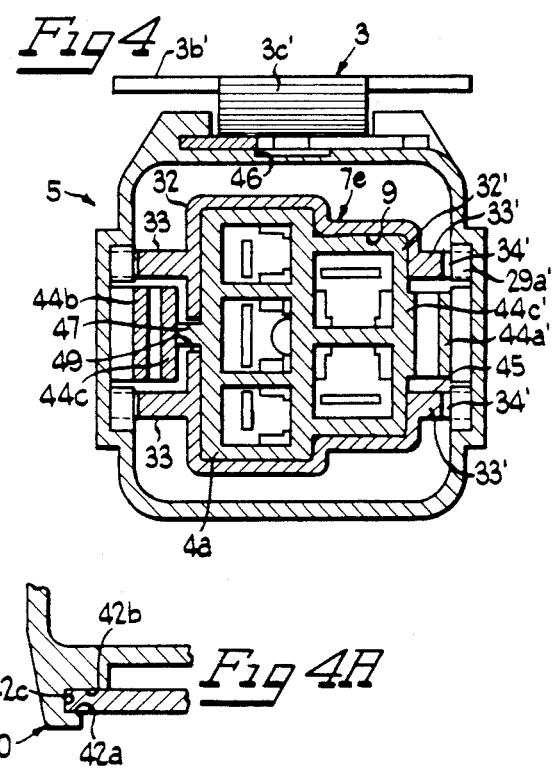
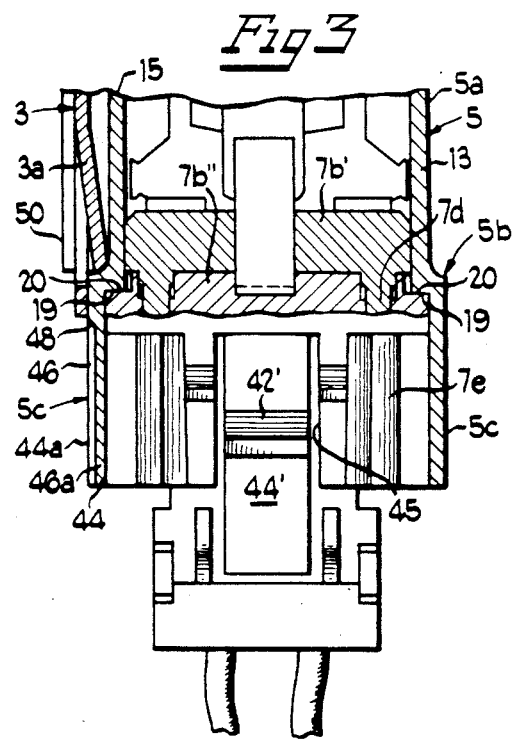

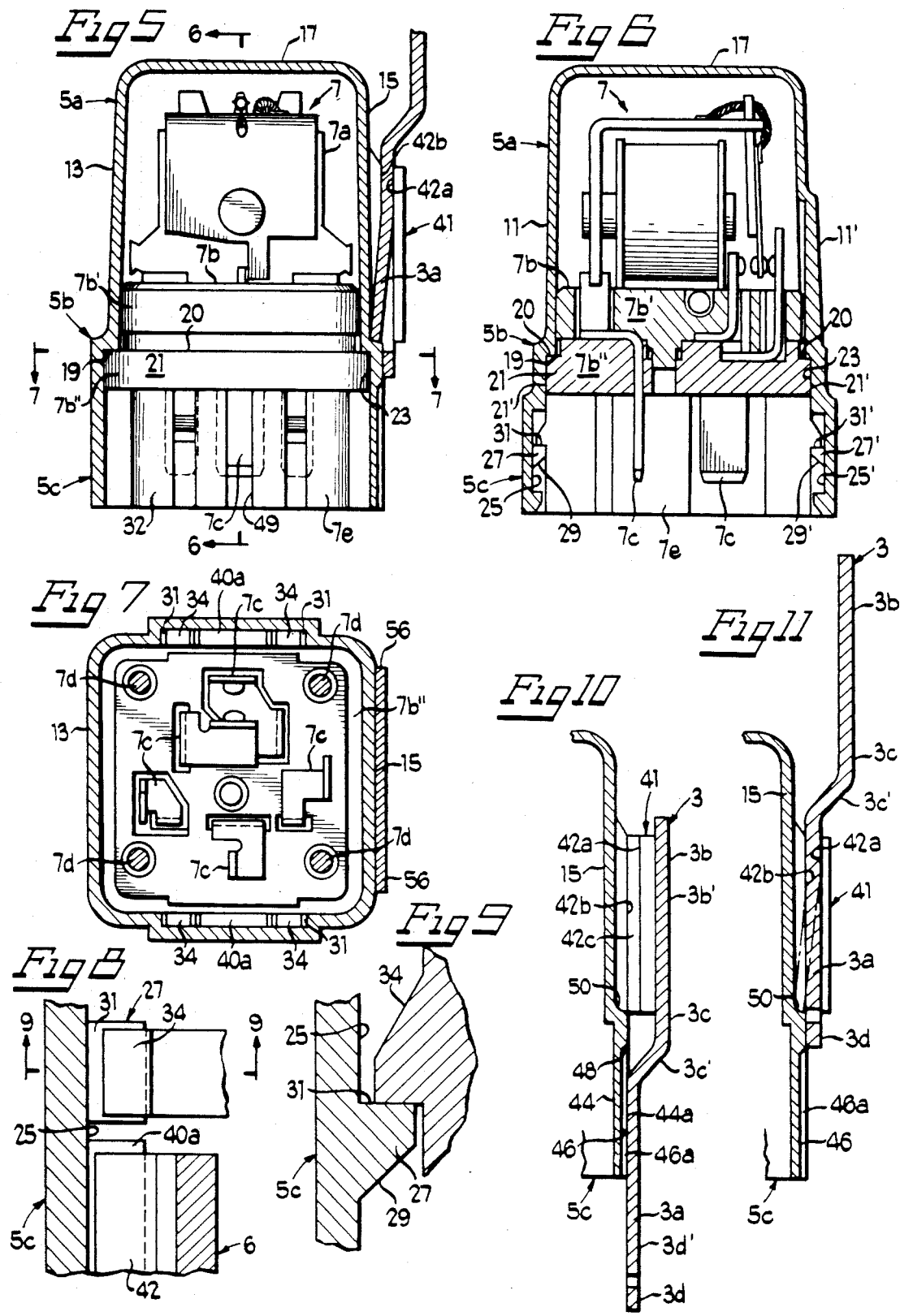

SEALED ELECTRICAL DEVICES

BACKGROUND OF INVENTION

This invention relates to sealed electrical devices, such as relays for automobiles mounted under the hoods thereof, used in environments where rain spray can gain access to the mounting locations of the devices. In such cases, it is important to the reliability of the devices that water does not gain access to them.

There is disclosed in recently granted U.S. Pat. No. 4,320,369 a unique plug-in relay construction useable in automobiles and which includes a support base of insulating material formed by a pair of insulating plates held together by rivets and between which are clamped the laterally extending portions of terminal blade members. A relay is supported on the innermost of these plates. A housing is disclosed which encloses the relay, the housing being an inverted cup-shaped member with the bottom edges of the housing resting upon a peripheral shoulder on the support base. In such a construction, splashing rainwater can gain ready access to the interior of the housing and the peripheral shoulder on the support base. This relay design is adapted primarily to an application where each relay assembly plugs into a stationary socket base mounted in a horizontal wall.

In many different relay unit designs, the relay unit housing is mounted by a bracket on a wall of the automobile involved. A cable with a connector block is applied to the terminal blade members of the relay. The connector block is commonly provided with a releasable resilient latching arm which interlocks with connector block guide wall extending from the relay support base. If such a connector block were to be used with the two-part riveted support base construction disclosed in said patent, if the user forgetfully tries to pull the connector block from the relay blade terminal members without releasing the connector latching arm from the support base connector guide wall, the forces involved can sometimes break the plastic rivets which connect the insulating plates forming the support base for the relay.

When relay assemblies are made with mounting brackets, the brackets have generally been formed integrally with the housings thereof so that a different housing design is often necessary for relay assemblies to be used in automobiles of varying designs where the points of connection of the brackets to the mounting walls involved vary with the different models of the automobiles involved.

The various aspects of the present invention to be described provides a plug-in electrical device, like a relay, which is an improvement over prior plug-in electrical device construction known to us in that the electrical device of the invention avoids one or more, and preferably all of, the prior art disadvantages described above.

SUMMARY OF THE INVENTION

In accordance with one of the features of the present invention, the housing of the relay or other electrical device involved has a unique construction which provides an improved sealing relationship between the housing and the support base previously utilized in the relay disclosed in U.S. Pat. No. 4,320,369. To this end, the housing has an intermediate portion provided with a stepped configuration which makes a face-to-face water-sealing contact with both longitudinally as well as laterally facing surfaces of the support base, so that there is no straight-on paths for rain water flow at the juncture of the housing and support base. This feature is not per se new in electrical device housings. However, the housing, in accordance with this aspect of the invention, uniquely has a skirt portion extending substantially beyond portions of the support base where the housing seals against the support base, so that the housing skirt portion isolates any crevices into which water may gain entry from any laterally directed water streams. Where the electrical device involved is a relay, which is normally oriented with the support base at the bottom of the device, the housing skirt portion prevents any direct access of a rain water stream to the interior thereof, except for water which would splash upwardly into the open bottom of the housing skirt portion, a very unlikely event; and even if such a vertical splashing water stream occurs, it would have to traverse the depth of the skirt to reach the portion of the support base sealed by the housing, which would normally prevent passage of the water through the interface between the housing and support base, in any event.

A related aspect of the feature of the invention now being described is that the housing can be permanently readily locked to the support base by providing locking shoulders on the inside of the housing skirt portion, which shoulders interlock with complimentary locking shoulders on the support base.

When the electrical device of the invention is of a type to be plugged into a cable attached connector block as described, it preferably has connector block guide walls as described extending from the support base which permit the connector block to be inserted into the skirt portion of the housing with only one orientation, to ensure a proper mating of the connector block terminals with the electrical device terminals. In accordance with another feature of the invention, to isolate the support base from any forces tending to separate the connector block from the device before the connector block latching arm is released from the device, the connector block is uniquely releasably latched to the skirt portion of the housing, rather than to a connector block guide wall. To this end, in the most preferred form of the invention, the inner surface of the skirt portion of the housing is provided with at least one locking shoulder which releasably receives the locking pawl of the latching arm of the connector block. A connector block guide wall of the support base is apertured to permit the passage of the connector block locking pawl therethrough. The housing skirt portion preferably also has a second locking shoulder which receives the locking nose of a separate latching member insertable between the skirt portion of the housing and a connector block guide wall on the opposite side of the housing from that receiving the connector block locking pawl. The latching member has a resilient arm with a shoulder fitting behind a shoulder on the connector block. It is thus now apparent that, should the user try to pull the connector block from the device terminals before releasing the latching arms of the connector block and latching member, the forces involved will be transferred to the housing rather than to the support base. If the support base comprises the previously described riveted or otherwise secured together pair of insulating plates clamped against the terminal blade members of the electrical device, the force applied by the user in trying to separate the connector block from the device before the latching arms are released cannot break the rivets or other securing means holding the insulating plates together since the separating force is relieved therefrom.

In accordance with still another feature of the invention, the housing of the electrical device is provided on an outer side thereof with a pair of confronting slideways open at one end for receiving the opposite parallel edges of the bracket-mounting portion of a bracket plate slidable into and out of the open ends of the slideways. The bracket plate has a bracket-mounting portion at the opposite end thereof of any desired configuration. There is provided on the relay housing abutment shoulders for engaging with both lateral projections and a tongue on the bracket plate to prevent movement of the bracket plate in either longitudinal direction when the bracket plate has been fully inserted into the slideways.

The above and other features and advantages of the invention will become apparent upon making reference to the specification to follow, the claims and the drawings.

DESCRIPTION OF DRAWINGS

FIG. 1 is a perspective view of an assembly of an electrical device, bracket plate, cable connector block and latching member in accordance with the most preferred form of the present invention;

FIG. 2 is a fragmentary side elevation of the lower portion of the assembly shown in FIG. 1, with the skirt portion of the housing broken away;

FIG. 3 is a fragmentary vertical section through the assembly shown in FIG. 2, taken along section line 3—3 therein;

FIG. 4 is a horizontal section of the assembly shown in FIG. 2, taken along section line 4—4 therein;

FIG. 4A is a fragmentary horizontal section through the assembly shown in FIG. 1, taken along section lines 4A—4A therein.

FIG. 5 is a central vertical section only through the housing of the assembly shown in FIGS. 1-4, with the female connector block removed therefrom;

FIG. 6 is a central vertical section through the assembly shown in FIG. 5, taken along section line 6—6 therein;

FIG. 7 is a horizontal sectional view through the assembly of FIG. 5, taken along section line 7—7 thereof;

FIG. 8 is a greatly enlarged fragmentary horizontal sectional view through the bottom portion of the assembly shown in FIG. 2, taken along section line 8—8 therein;

FIG. 9 is a horizontal sectional view through the portion of the assembly shown in FIG. 8, taken along section line 9—9 therein;

FIG. 10 is a fragmentary central vertical sectional view through the bracket plate mounting walls of the relay unit housing, showing the bracket plate in a position to be moved into a pair of slideways of the housing; and FIG. 11 is a sectional view corresponding to that shown in FIG. 10 after the bracket plate has been fully inserted into the slideways.

DESCRIPTION OF EXEMPLARY FORM OF THE INVENTION SHOWN IN DRAWINGS

Referring now more particularly to FIGS. 1 through 3, the assembly thereshown comprises a relay unit generally indicated by reference 1 which is preferably made to a standard specification, a bracket plate 3 which is removably mounted upon one side of an insulating housing of the relay unit, a cable 4 with a connector block 4a on the end thereof inserted into the open bottom of the housing 5 to make electrical contact with projecting terminal members of the relay unit, and a latching member 6 for locking the connector block 4a in place. The housing 5 is preferably a single, synthetic plastic molded piece completely enclosing a relay sub-assembly 7 (FIGS. 5 and 6) mounted on the support base 7b of the relay unit. The relay sub-assembly can be made in most respects like the relay sub-assembly disclosed in said U.S. Pat. No. 4,320,369. It thus comprises a relay bobbin and armature structure 7a supported on the support base 7b comprising upper and lower support base sections 7b' and 7b" aligned and held together in any suitable way, such as by an adhesive and/or pins or rivets 7a (FIG. 7). The terminal members are sandwiched between the confronting faces of the support base section 7b' and 7b". The terminal members are illustrated as blade members which project upwardly into the space above the support base 7b where they make electrical connections with relay windings and stationary and movable contacts of a conventional type single-pole, double-throw switch providing a selection of normally open and normally closed contacts. Such a relay has 5 terminals. The terminal blade members 7c also project downwardly into a space enclosed for the most part by a shroud forming longitudinally extending connector block guide walls 7e. The connector block has socket terminals which mate with the downwardly projecting portions of the terminal blade members 7c in only one orientation of the connector block. Thus, FIG. 4 illustrates the guide walls 7e forming a guide channel 9 which corresponds generally to the irregular outer configuration of the connector block 4a and slidably receives the connector block 4a in only one orientation thereof.

The housing 5 has an upper relay-enclosing portion 5a (FIGS. 1, 5 and 6) illustrated as having a cubic shape and including vertical side walls 11—11', a front wall 13, rear wall 15 and a top wall 17. The housing further has an intermediate stepped portion 5b defining a downwardly facing shoulder 19 (FIGS. 5 and 6) around the housing making a face-to-face sealing contact with the flat upper face 20 of a flanged portion 21 of the bottom section 7b" of the support base 7b. The stepped intermediate portion 5b of the housing has vertical inner surfaces 23 making face-to-face sealing contact with the side faces 21' of the flanged portion 21 of the support base. The intermediate portion 5b of the housing terminates in a skirt portion 5c which extends longitudinally substantially beyond the portion of the support base with which the intermediate portion 5b of the housing makes sealing engagement so that a vertical water stream, which could be rain water directed by splashing upwardly into the open bottom of the skirt portion 5c, would not normally reach the points where the sealing surfaces between the housing and support base are located. (Water reaching such surfaces could then only gain access to the upper housing interior only by capillary action through imperfectly sealed portions of these interfaces, which would be a highly unlikely occurrence.)

While the housing 5 may be secured to the support base 7 in a number of ways, in the preferred form of the invention it is secured by housing locking means associated with the housing skirt portion 5c and engaging with the connector block guide walls 7e of the support base. To this end, as shown in FIGS. 2, 6 and 9, the opposite inner faces 25—25' of the housing skirt portion 5c are provided with spaced pairs of projecting means 27—27' each having a downwardly inclining surface 29 or 29' terminating at the top thereof in an upwardly facing locking shoulder 31 or 31'. The opposite support base guide walls 32—32' (FIG. 4) have complementary pairs of projecting means 33—33 and 33'—33' each having upwardly inclining surface 34 or 34' (FIG. 2) terminating at the top thereof in a downwardly facing locking shoulder 36 or 36'. When the housing 5 is applied over the support base 7b, the projecting means 27—27' of the skirt portion 5b will interlock with the complementary projecting means 33—33' of the guide walls of 32—32', to lock the housing in a position where the sealing surfaces of the housing and support base referred to are in sealing engagement.

There is provided between and below each pair of housing skirt projecting means 27—27 and 27'—27' an upwardly facing locking shoulder 40a or 40a' (FIG. 2) formed by an inwardly projecting lip 40 or 40'. The shoulders 40a—40a' interlock with the latching pawls 42—42' respectively of the latching member 6 and connector block securing means 44' furnished by an extension of the connector block 4a. The connector block securing means 44' is formed by a resilient, longitudinally extending latching arm 44a' which projects below the bottom of the housing skirt portion 5b where it can be pressed inwardly to move the latching pawl 42' projecting from the latching arm 44a' inwardly, to release the same from the locking shoulder 40a' of the housing skirt portion 5b. The upper end of this arm 44a' joins a connecting portion 44c' which passes through an opening 45 in the guide wall 32' (FIG. 4). When the connector block 4a is initially pushed into position within the skirt portion 5b of the housing and engages the terminal blade members 7c, an upwardly inclined surface 44b' on the latching pawl 42' engages the housing skirt lip 40' which cams the latching arm 44a' inwardly, the latching pawl 42' then snapping into place behind the locking shoulder 40a'. The connector block 4a has a guide rib 47 guided in a guide slot 49 in the guide wall 32.

The latching member 6 includes a longitudinally extending resilient latching arm 44a terminating at the upper end thereof in a reversely bent-back portion 44b terminating in the latching pawl 42 which engages with the locking shoulder 40a of the skirt portion 5b. The latching arm 44a terminates at the bottom thereof in an inwardly projecting lip 44c which underlies the bottom portion of the connector block 4a.

It can be best seen in FIG. 2 that an attempt by the user to pull the connector block from the terminal member 7c will be blocked by the locking shoulders 40a' of the housing skirt portion and by the lip 44c of the latching member 44. The blocking force is thus transmitted to the housing rather than to the support base 7b.

To remove the connector block 4a from the relay unit as viewed in FIG. 2, the user pushes the latching member 6 outwardly with one hand to withdraw the lip 44c from behind the connector block 4a. With his other hand, he presses inwardly against the bottom end of the resilient latching arm 44a' of the connector block 4a, to remove the locking pawl 42' from the locking shoulder 40a' so that he can pull the connector block from the terminal member 7c with force from the latter hand.

As previously indicated, one of the unique aspects of the invention is the bracket plate 3 which, by being removably mountable on the relay unit, enables all parts of the relay unit except the bracket plate to be made to a standard design and to be mountable in any automobile with a bracket plate designed for the particular automobile involved. Accordingly, molded integrally with the housing wall 15 of the relay-enclosing portion 5a of the housing 5 along opposite vertical margins thereof are a pair of spaced, confronting vertical slideways 41a—41a formed by vertical housing extensions 41—41. Each slideway is defined by an outermost vertical inwardly facing flat surface 42a (FIG. 4A), and innermost vertical outwardly facing flat surface 42b parallel to the surface 42a and a side surface 42c extending transversely between the surfaces 42a and 42b. The confronting laterally inwardly facing sides of the slideways 41a and the ends thereof are open. As best shown in FIGS. 3, 10 and 11, the innermost vertical surface 42b of each slideway 41a merges with and is in the same plane as the outer face 44a of the rear wall 44 of the housing skirt portion 5c. The wall 44 has a groove or slot 46 opening onto the bottom edge thereof. The slot 46 has an inner vertical surface 46a which at the upper end thereof intersects a raised downwardly inclined surface 48 which joins the outer surface 44a of the wall 44. At the juncture between the housing walls 15 and 44 is an external upwardly facing shoulder 50 which acts as a locking shoulder for a depending locking tongue 3a of the bracket plate 3.

Referring now more particularly to FIGS. 1, 10, and 11, the bracket plate 3 is provided with a flat, anchoring head portion 3b having a horizontally, elongated, rectangular shape. The head portion has a circular hole 52 and a horizontally elongated hole 54 respectively through which anchoring bolts or screws can be passed to anchor the bracket to a vertical wall in the automobile involved. The size of the bracket portion 3b and location and size of the holes 52 and 54 will depend upon the mounting environment involved. Extending downwardly in coplanar relationship to the head portion 3b is a bracket neck portion 3c which through a bent neck portion 3c' joins a flat, wider shank portion 3d in a plane parallel to but offset from the head portion a distance which spaces the planes of the front faces 3b' and 3d' of the head and shank portion 3b and 3d the same distance as the spacing between flat outer side surfaces 41b-41d of the slideway-forming extensions 41—41 and the housing surfaces 42b-44a. The bracket shank portion 3d presents laterally projecting marginal portions 3d"—3d" which are insertable into the open bottom ends of the slideways 41a—41a when the bracket plate is positioned as shown in FIG. 10, where the front faces 3b' and 3d' of the head and shank portions 3b and 3d thereof are placed against the housing extension and skirt surfaces 41b-44a.

The bracket plate tongue 3a is struck from the shank portion 3d of the bracket plate, is initially in the general plane of the shank portion 3d, as shown in FIG. 10. The metal out of which the bracket plate is made is preferably such that the tongue can be readily permanently bent inwardly of the general plane of the shank portion 3d of the bracket plate, as shown in solid lines in FIG. 3 and in dashed lines FIG. 11, after the bracket plate has been substantially fully inserted into the slideways 40a—40a. The bracket plate shank portion 3d terminates at the bottom thereof in laterally extending wings 56—56 (FIG. 1) which limit the insertion of the shank portion 3d of the bracket into the slideways 41a—41a as the bracket wings 56—56 contact the bottom ends of the slideway-forming extensions 41—41. Then, the bottom end of the tongue 3a is opposite the upwardly facing shoulder 50 of the housing. The bracket plate is then permanently anchored by pushing the tongue 3a inwardly to bring the tongue over the shoulder 50, which then prevents withdrawal of the bracket plate 3 from the slideways 41a—41a. It is apparent that the bracket plate is then anchored in place upon the housing so that it cannot move appreciably longitudinally, or laterally due to the slideway side surfaces 42c—42c adjacent to which the marginal portions 3d''—3d'' of the bracket plate are located.

It should now be apparent that the most preferred form of the present invention provides a standard relay unit having a mounting flexibility which permits the selection and easy insertion and anchoring thereon of a bracket plate with an anchoring head portion of the desired size, shape and mounting hole location for the automobile mounting location involved. Also, the cable connector block 4a inadvertently pulled before release thereof from the housing skirt without danger of damaging the support base 7b which supports the relay device. Moreover, the housing 5 of the relay unit is provided with a unique construction which provides a stepped sealing interface with the support base, and also a skirt which isolates the sealing portions thereof from any lateral rainwater streams or weak upwardly splashing rainwater streams.

It should be understood that numerous modifications may be made in the most preferred form of the invention just described without deviating from the broader aspects of the invention.

We claim:

1. In a combination including a support base, an electrical device on the inner side of said support base, said support base having longitudinally-exposed terminals on the outside of said support base for feeding current to said device, and a housing having a device-enclosing portion covering and surrounding said device on the inner side of said support base, and an intermediate portion forming a continuation of said device-enclosing portion, which intermediate portion makes face-to-face engagement with at least longitudinally outwardly facing surfaces of said support base so that there is little or no straight-on access of a water stream external to said housing into the interior of said housing on the inner side of said support base from either a lateral or longitudinal direction, said intermediate portion terminating in a skirt-forming end portion extending a substantial distance longitudinally beyond said sealed portion of said support base to act as a further barrier against the ingress of an external water stream into the interior of said housing on the inner side of said support base, the improvement wherein said support base has longitudinally extending wall means on the outer side thereof enclosed by said skirt portion of said housing, and said housing being secured to said support base by interlocking means on the inside of said skirt portion and the outside of said longitudinally extending wall means, said longitudinally extending wall means form connector unit guide wall means for guiding a connector unit with terminals complimentary to said exposed base terminals into mating engagement with said base terminals in only one orientation of said connector unit, and there is provided means for interlocking said housing skirt portion with a releasable locking means on said connector unit so that if the connector is pulled longitudinally outwardly before being released from said housing the forces involved will be transmitted to said housing rather than to said support base.

2. The combination of claim 1 wherein said interlocking means includes a locking shoulder formed on the inside of said housing skirt portion for engaging with a complimentary releasable locking portion on said connector unit.

3. The combination of claim 1 or 2 wherein said means for interlocking said connector unit and skirt portion of said housing includes a releasable resilient anchoring member initially separate from said connector unit and housing and interposable therebetween and having means for interlocking both with the inside of said skirt portion of said housing and a longitudinally outwardly-facing shoulder on said connector unit.

4. The combination of claim 2 combined with said connector unit wherein said releasable locking means thereof is a resilient latching arm projecting therefrom and having a locking pawl projection engaging with said locking shoulder on said housing skirt portion.

5. The combination of claim 4 wherein said resilient latching arm is displaceable laterally to permit the withdrawal of said connector unit from the skirt portion of said housing when the connector unit is otherwise released therefrom.

6. The combination of claim 2 combined with said connector unit, said releasable locking means of the connector unit is a resilient latching arm projecting therefrom and having a locking pawl projection engaging with said locking shoulder on said housing skirt portion, said interlocking means also including a releasable resilient anchoring member initially separate from said connector unit and housing and interposable therebetween and having means for interlocking both with the inside of said skirt portion of said housing and a longitudinally outwardly-facing shoulder on said connector unit, said anchoring member having a resilient latching arm projecting from said housing skirt portion and having a locking pawl projection positioned behind said longitudinally outwardly facing shoulder on said connector unit, and said resilient latching arms on said connector unit and anchoring member being displaceable laterally to permit the withdrawal of said connector unit from the skirt portion of said housing.

7. The combination of claim 6 wherein said resilient latching arms on said connector unit and anchoring member project from opposite sides of the housing skirt portion.

* * * * *